(12) United States Patent
Lim

(10) Patent No.: US 7,459,332 B2
(45) Date of Patent: Dec. 2, 2008

(54) CMOS IMAGE SENSOR AND METHOD FOR MANUFACTURING THE SAME

(75) Inventor: Keun Hyuk Lim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 88 days.

(21) Appl. No.: 11/615,069

(22) Filed: Dec. 22, 2006

(65) Prior Publication Data

US 2007/0145510 A1    Jun. 28, 2007

(30) Foreign Application Priority Data

Dec. 28, 2005   (KR) .................. 10-2005-0132727

(51) Int. Cl.
*H01L 21/339* (2006.01)
(52) U.S. Cl. ........................ 438/59; 257/292
(58) Field of Classification Search ................ 257/462, 257/E23.133, 292; 438/59, 180–185
See application file for complete search history.

(56) References Cited

U.S. PATENT DOCUMENTS 6,583,043 B2 *  6/2003  Shroff et al. ............... 438/618
7,232,712 B2 *  6/2007  Han ............................ 438/144

FOREIGN PATENT DOCUMENTS

KR   10-2002-0085068     7/2004

* cited by examiner

*Primary Examiner*—Tom Thomaqs
*Assistant Examiner*—Hajar Kolahdouzan
(74) *Attorney, Agent, or Firm*—Saliwanchik, Lloyd & Saliwanchik

(57) ABSTRACT

A CMOS image sensor and method for fabricating same are provided. The CMOS image sensor can include a gate electrode formed on an active area of a first conductive type semiconductor substrate, on which a photodiode area and a transistor area are defined; a low-density second conductive type diffusion region formed on the photodiode area at a first side of the gate electrode; a high-density second conductive the diffusion region formed on the transistor area at a second side of the gate electrode; an insulating layer formed on the semiconductor substrate at both sides of the gate electrode with a thickness less than a thickness of the gate electrode, but greater than a thickness of a gate insulating layer; and insulating layer sidewalls formed on the insulating layer at both sides of the gate electrode.

6 Claims, 6 Drawing Sheets

CMOS IMAGE SENSOR AND METHOD FOR MANUFACTURING THE SAME

RELATED APPLICATION(S)

This application claims priority under 35 U.S.C. §119(e) of Korean Patent Application No. 10-2005-0132727 filed Dec. 28, 2005, which is incorporated herein by reference in its entirety.

FIELD OF THE INVENTION

The present invention relates to a complementary metal oxide semiconductor (CMOS) image sensor.

BACKGROUND OF THE INVENTION

In general, an image sensor is a semiconductor device for converting optical images into electric signals, and is mainly classified as a charge coupled device (CCD) or a CMOS image sensor.

The CCD has a plurality of photodiodes (PDs), which are arranged in the form of a matrix in order to convert optical signals into electric signals. The CCD includes a plurality of vertical charge coupled devices (VCCDs) provided between photodiodes and vertically arranged in the matrix so as to transmit electrical charges in the vertical direction when the electrical charges are generated from each photodiode. The CCD also includes a plurality of horizontal charge coupled devices (HCCDs) for transmitting the electrical charges that have been transmitted from the VCCDs in the horizontal direction, and a sense amplifier for outputting electric signals by sensing the electrical charges being transmitted in the horizontal direction.

However, the CCD has various disadvantages, such as a complicated drive mode and high power consumption. Also, the CCD requires multi-step photo processes, so the manufacturing process for the CCD is complicated.

In addition, since it is difficult to integrate a controller, a signal processor, and an analog/digital converter (A/D converter) onto a single chip of the CCD, the CCD is not suitable for compact-size products.

Recently, the CMOS image sensor is spotlighted as a next-generation image sensor capable of solving the problems of the CCD.

The CMOS image sensor is a device employing a switching mode to sequentially detect an output of each unit pixel by means of MOS transistors, in which the MOS transistors are formed on a semiconductor substrate corresponding to the unit pixels through a CMOS technology and using peripheral devices, such as a controller and a signal processor.

That is, the CMOS image sensor includes a photodiode and a MOS transistor in each unit pixel, and sequentially detects the electric signals of each unit pixel in a switching mode to realize images.

Since the CMOS image sensor makes use of CMOS technology, the CMOS image sensor has advantages such as low power consumption and a simple manufacturing process with a relatively smaller number of photo processing steps.

In addition, the CMOS image sensor allows the product to have a compact size, because the controller, the signal processor, and the A/D converter can be integrated onto a single chip.

Therefore, CMOS image sensors have been extensively used in various applications, such as digital still cameras and digital video cameras.

The CMOS image sensors are classified as 3T-type, 4T-type and 5T-type CMOS image sensors according to the number of transistors formed in a unit pixel. The 3T-type CMOS image sensor includes one photodiode and three transistors, and the 4T-type CMOS image sensor includes one photodiode and four transistors.

The layout for a conventional unit pixel of the 4T-type CMOS image sensor is as follows:

FIG. 1 is an equivalent circuit diagram illustrating a 4T-type CMOS image sensor according to a related art, and FIG. 2 is a layout view showing a unit pixel of the 4T-type CMOS image sensor according to the related art.

As shown in FIG. 1, a unit pixel 100 of the CMOS image sensor includes a photodiode 10, which is an optoelectronic device, and four transistors.

Here, the four transistors include a transfer transistor 20, a reset transistor 30, a drive transistor 40, and a select transistor 50. In addition, a load transistor 60 is electrically connected to an output terminal OUT of each unit pixel 100.

Reference characters FD, Tx, Rx, Dx, and Sx represent a floating diffusion area, the gate voltage of the transfer transistor 20, the gate voltage of the reset transistor 30, the gate voltage of the drive transistor, and the gate voltage of the select transistor, respectively.

As shown in FIG. 2, the unit pixel of the CMOS image sensor has an active area defined thereon and an isolation layer formed on a predetermined area of the unit pixel except for the active area. The photodiode PD is formed on a wider region of the active area, and gate electrodes 23, 33, 43 and 53 of the four transistors are formed overlapping the remaining regions of the active area.

The first gate electrode 23 corresponds to the transfer transistor 20, the second gate electrode 33 corresponds to the reset transistor 30, the third gate electrode 43 corresponds to the drive transistor 40, and the fourth gate electrode 53 corresponds to the select transistor 50.

Dopants are implanted into the active area of each transistor except for lower portions of the gate electrodes 23, 33, 43 and 53, so that source/drain (S/D) areas of the transistors are formed.

FIGS. 3A to 3E are sectional views taken along line I-I' of FIG. 2 to illustrate the procedure for fabricating a CMOS image sensor according to the related art.

Referring to FIG. 3A, an epitaxial process is performed relative to a high-density P$^{++}$ semiconductor substrate 61, thereby forming a low-density P$^-$ epitaxial layer 62.

Then, after defining an active area and an isolation area on the semiconductor substrate 61, an isolation layer 63 is formed on the isolation area through an STI (shallow trench isolation) process or a LOCOS process.

In addition, a gate insulating layer 64 and a conductive layer 65a (for example, a high-density multi-crystalline silicon layer) are sequentially deposited on the entire surface of the epitaxial layer 62 formed with the isolation layer 63.

Then, a first photoresist film 66 is coated on the conductive layer 65a, and then the first photoresist film 66 is patterned by an exposure and development process to define a gate area.

After that, referring to FIG. 3B, the conductive layer 65a and the gate insulating layer 64 are selectively removed using the patterned first photoresist film 66 as a mask, thereby forming a gate electrode 65.

Then, referring to FIG. 3C, the first photoresist film 66 is removed, and a second photoresist film 67 is coated on the entire surface of the semiconductor substrate 61 including the gate electrode. Then, the second photoresist film 67 is selectively patterned by an exposure and development process, to expose the photodiode area.

Then, low-density n-type dopants are implanted into the exposed photodiode area, thereby forming the low-density n-type diffusion area 68.

Here, the low-density n-type diffuision area 68 is deeply formed by using a high energy implant to improve the sensitivity of the image sensor.

The low-density n-type diffusion area 68 is a source area of the reset transistor Rx shown in FIGS. 1 and 2).

Then, referring to FIG. 3D, the second photoresist film 67 is completely removed, and a silicon nitride (SiN) layer is formed on the entire surface of the semiconductor substrate 61 including the gate electrode 65. An etch-back process is performed relative to the entire surface of the semiconductor substrate 61, to form insulating layer sidewalls 69 at both sides of the gate electrode 65.

Then, a third photoresist film 70 is coated on the entire surface of the semiconductor substrate 61, and selectively patterned by an exposure and development process to define a source/drain area.

Then, high-density n+ type dopants are implanted into the exposed source/drain area using the patterned third photoresist film 70 as a mask, thereby forming a high-density n+ type diffusion area 71.

Then, referring to FIG. 3E, the third photoresist film 70 is removed and a heat-treatment process (for example, a rapid thermal process) is performed with respect to the semiconductor substrate 61, thereby diffusing dopants in the n type diffusion area 68 and the n+ type diffusion area 71.

However, the conventional method of fabricating the CMOS image sensor has following problems.

When the gate is formed by the conventional CMOS fabrication process, damage is caused to the surface of the photodiode during the etching process for patterning the gate, thereby incurring dark current of the photodiode.

That is, when forming the gate electrode and the insulating layer sidewall, damage occurs on the surface of the semiconductor substrate. In addition, since the insulating layer sidewall is made from a silicon nitride layer, the surface of the semiconductor substrate is subject to stress due to silicon nitride, so that leakage current is generated, degrading the performance of the image sensor.

BRIEF SUMMARY

Accordingly, an object of embodiments of the present invention is to provide a CMOS image sensor and a method of fabricating the same, capable of minimizing or preventing damage from occurring in the semiconductor substrate when forming a gate electrode and an insulating layer sidewall.

To achieve the above object, the present invention provides a CMOS image sensor including a gate electrode formed on an active area of a first conductive type semiconductor substrate, on which a photodiode area and a transistor area are defined, a low-density second conductive type diffusion area formed on the photodiode area at a first side of the gate electrode, a high-density second conductive type diffusion area formed on the transistor area at a second side of the gate electrode, an insulating layer formed on the semiconductor substrate at both sides of the gate electrode with a thickness less than a thickness of the gate electrode but larger tan a thickness of a gate insulating layer, and insulating layer sidewalls formed on the insulating layer at both sides of the gate electrode.

The present invention also provides a method of fabricating a CMOS image sensor, the method of comprising: forming an insulating layer on a first conductive type semiconductor substrate, on which a photodiode area and a transistor area are defined; defining a gate area by selectively removing the insulating layer such that a predetermined portion of a surface of the semiconductor substrate is exposed; forming a gate insulating layer on the surface of the exposed semiconductor substrate; forming a conductive layer on an entire surface of the semiconductor substrate and planarizing the conductive layer by adopting a top surface of the insulating layer as an end point, thereby forming a gate electrode on the gate insulating layer; reducing a thickness of the insulating layer at both sides of the gate electrode; forming an insulating layer sidewall on the insulating layer at both sides of the gate electrode; forming a low-density second conductive type diffusion area on the photodiode area at a first side of the gate electrode; and forming a high-density second conductive type diffusion area on the transistor area at a second side of the gate electrode.

BRIEF DESCRIPTION OF THTE DRAWINGS

DETAILED DESCRIPTION OF THE INVENTION

Hereinafter, a CMOS image sensor and a method of fabricating the same according to the preferred embodiments of present invention will be described with reference to the accompanying drawings.

Figure 4:
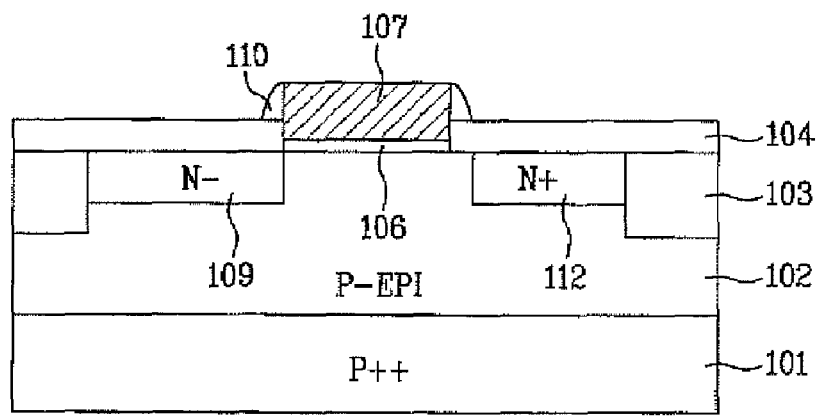
FIG. 4 is a sectional view illustrating the structure of a CMOS image sensor according to an embodiment of the present invention.

FIG. 4 is a sectional view illustrating the structure of a CMOS image sensor according to an embodiment of the present invention.

As shown in FIG. 4, the CMOS image sensor can include a p⁻ type epitaxial layer 102 formed on a p++ type conductive semiconductor substrate 101, on which a photodiode area and a transistor area are defined; an isolation layer 103 formed on a field area to define an active area of the semiconductor substrate 101; a gate electrode 107 formed on the active area of the semiconductor substrate 101 with a gate insulating layer 106 interposed therebetween; a low-density n− type diffusion area 109 formed in the photodiode area at one side of the gate electrode 107; a high-density n+ type diffusion area 112 formed in the transistor area at the other side of the gate electrode 107; an insulating layer 104 formed on the semiconductor substrate 101 at both sides of the gate electrode 107 with a thickness less than that of the gate electrode;, and an insulating layer sidewall 110 including an oxide layer being formed on the insulating layer 104 at both lateral sides of the gate electrode 107.

Figure 1:
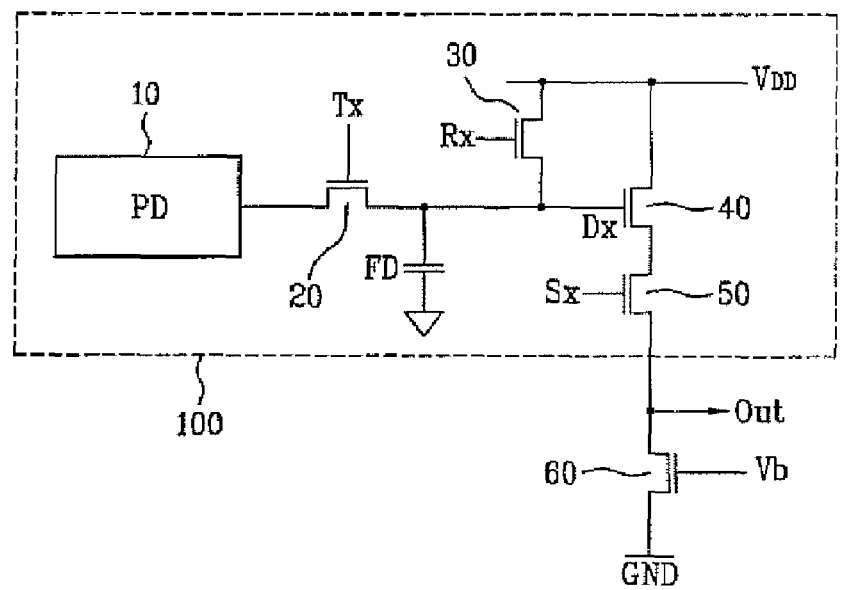
FIG. 1 is an equivalent circuit diagram illustrating a 4T-type CMOS image sensor according to a related art.
Figure 2:
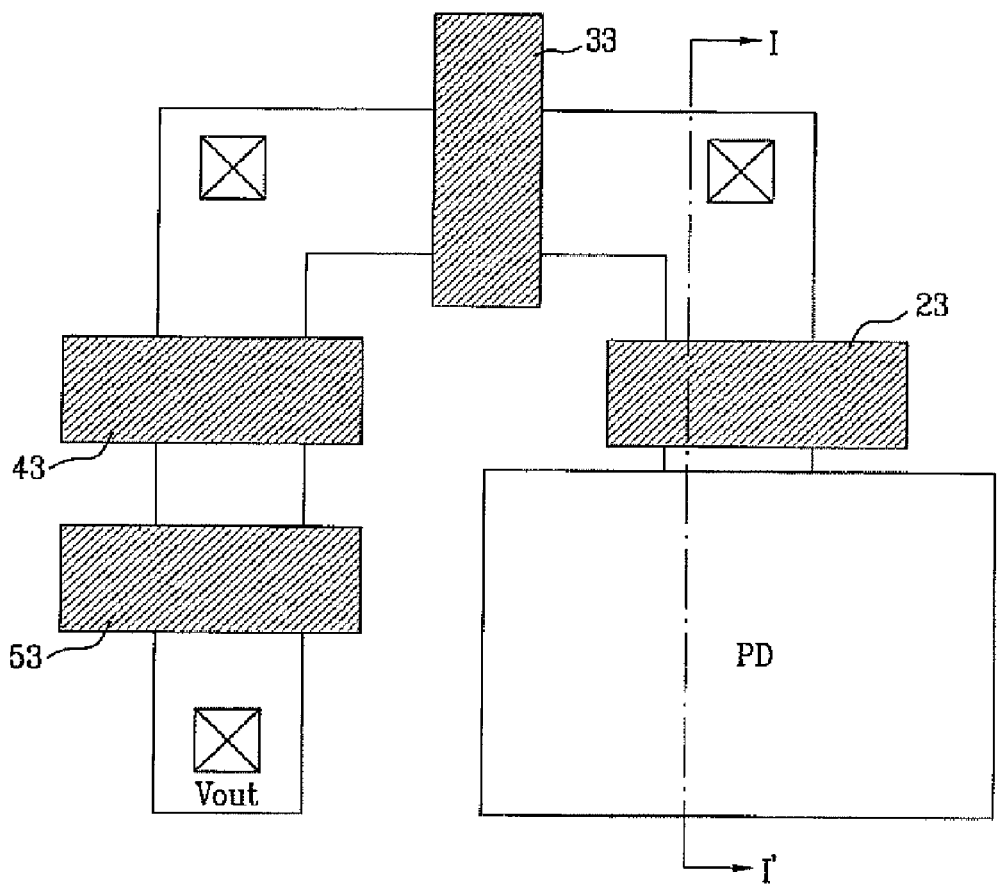
FIG. 2 is a layout view showing a unit pixel of the 4T-type CMOS image sensor according to the related art.
Figure 3A:
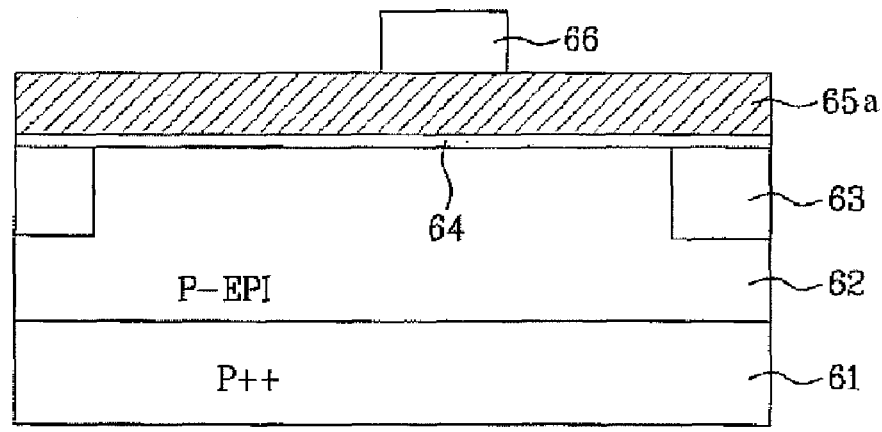
FIGS. 3A to 3E are sectional views taken along line I-I' of FIG. 2 to illustrate the procedure for fabricating a CMOS image sensor according to the related art.
Figure 3B:
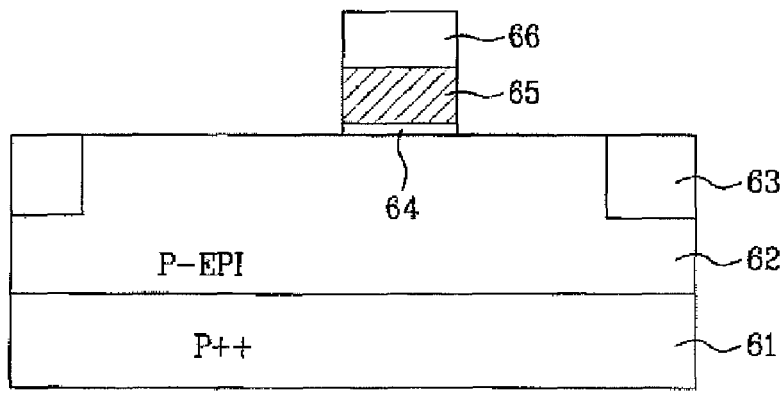
Figure 3C:
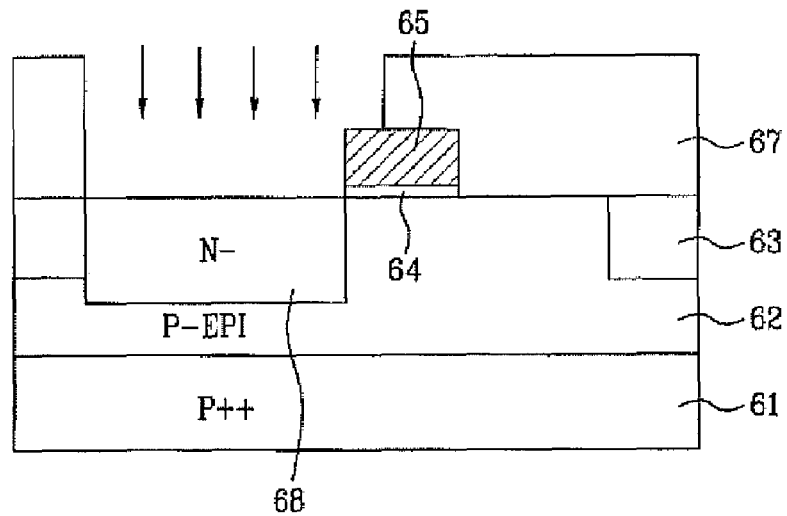
Figure 3D:
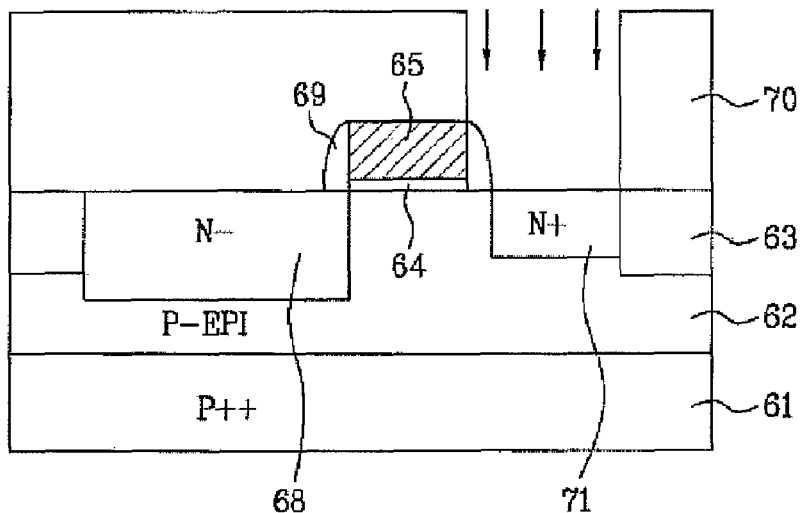
Figure 3E:
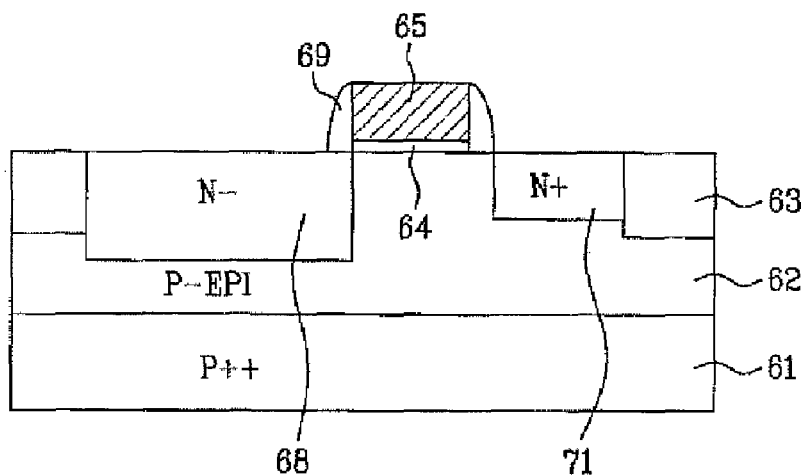

FIGS. 5A to 5H are sectional views taken along line I-I' of FIG. 2 to illustrate a procedure for fabricating a CMOS image sensor according to an embodiment of the present invention.

Figure 5A:
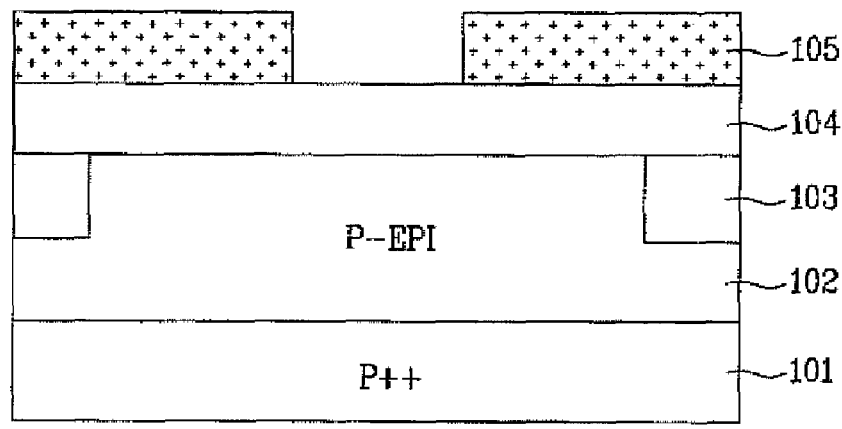
FIGS. 5A to 5H are sectional views taken along line I-I' of FIG. 2 to illustrate a procedure for fabricating a CMOS image sensor according to an embodiment of the present invention.

Referring to FIG. 5A, an epitaxial process can be performed with respect to the semiconductor substrate 101 to form a low-density first conductive (p− type) epitaxial layer 102 on the semiconductor substrate 101. The semiconductor substrate 101 can be formed of a first conductive type (p++ type) single-crystalline silicon.

The epitaxial layer 102 provides a wide and deep depletion region for the photodiode. Thus, the performance of a low-voltage photodiode, that collects photo charges, may increase and the photo sensitivity may be improved.

In another embodiment, the p type epitaxial layer can be formed on an n type substrate.

Then, an isolation layer 103 can be formed on the semiconductor substrate 101 having the epitaxial layer for providing device isolation.

Although not shown in the drawings, the process for forming the isolation layer 103 can be as follows:

First, a pad oxide layer, a pad nitride layer and a TEOS (tetra ethyl ortho silicate) oxide layer are sequentially formed on a semiconductor substrate. Then, a photoresist film is formed on the TEOS oxide layer.

After that, the photoresist film is subject to an exposure and development process using a mask that defines an active area and an isolation area, thereby patterning the photoresist film. At this time, the photoresist film formed on the isolation area is removed.

Then, the pad oxide layer, the pad nitride layer and the TEOS oxide layer on the isolation area are selectively removed using the patterned photoresist film as a mask.

Next, the isolation area of the semiconductor substrate is etched to a predetermined depth using the patterned pad oxide layer, pad nitride layer and TEOS oxide layer as an etch mask, thereby forming a trench. After that, the photoresist film is completely removed.

Then, a sacrificial oxide layer is shallowly formed on the entire surface of the substrate having the trench, and an $O_3$ TEOS layer is formed on the substrate in such a manner that the trench is filled with the $O_3$ TEOS layer. The $O_3$ TEOS layer can be formed under the temperature condition of about 1000° C. or above.

After that, the $O_3$ TEOS layer is removed by performing a CMP (chemical mechanical polishing) process such that the $O_3$ TEOS layer may remain only in the trench area, thereby forming the isolation layer 103 in the trench. Then, the pad oxide layer, the pad nitride layer and the TEOS layer are removed.

Referring again to FIG. 5A, an insulating layer 104 can be formed on the entire surface of the epitaxial layer 102 having the isolation layer 103, and a first photoresist film 105 can be coated on the insulating layer 104. In this state, the first photoresist film 105 can be selectively patterned by exposure and development processes to define a gate area.

Figure 5B:
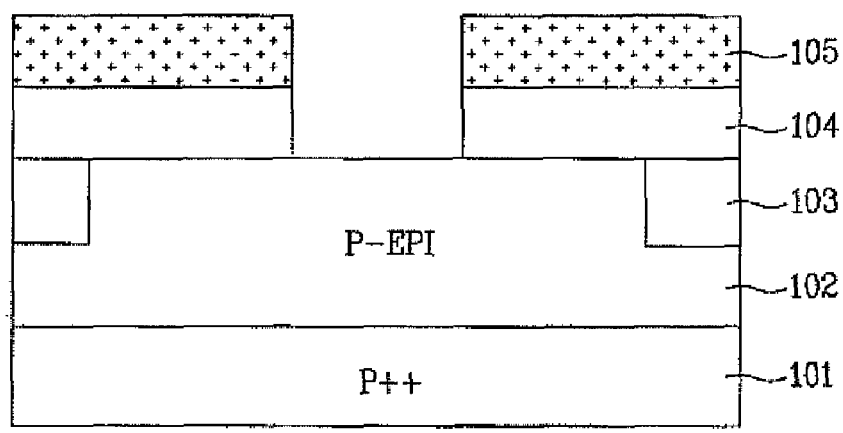

Then, referring to FIG. 5B, the insulating layer 104 can be selectively removed using the patterned first photoresist film 105 as a mask, thereby exposing the gate area.

Figure 5C:
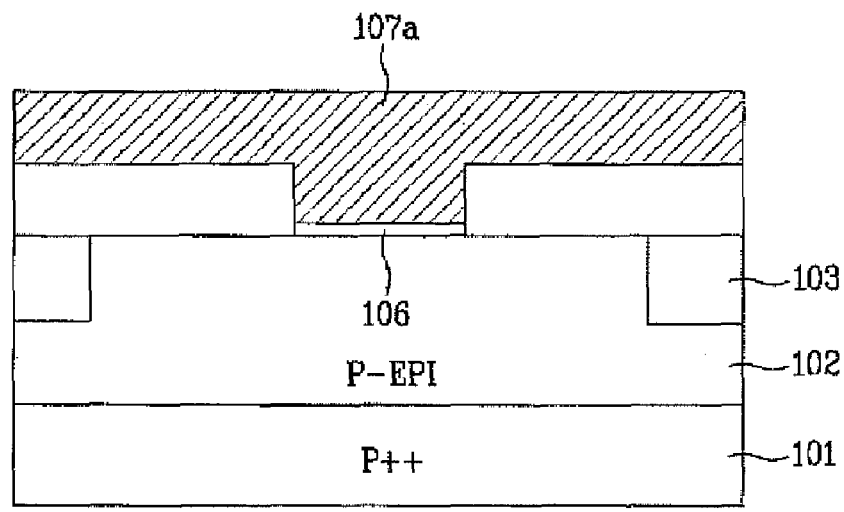

After that, referring to FIG. 5C, the first photoresist layer 105 can be removed and a gate insulating layer 106 can be formed on the surface of the semiconductor substrate. Then, a conductive layer 107a (for example, a high-density multi-crystalline silicon layer) can be formed on the entire surface of the semiconductor substrate 101 including the gate insulating layer 106.

In one embodiment, the gate insulating layer 106 can be formed through a thermal oxidation process or a CVD (chemical vapor deposition) process.

Figure 5D:
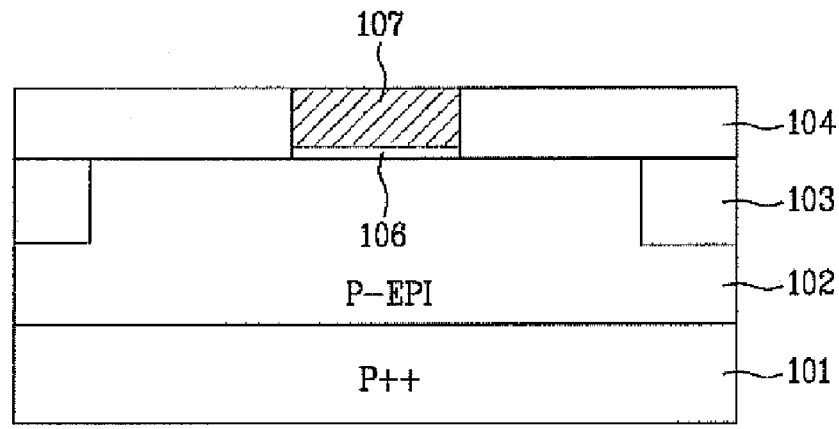

Then, referring to FIG. 5D, a CMP process can be performed with respect to the entire surface of the semiconductor substrate 101 to form the gate electrode 107 on the gate insulating layer 106 situated between the insulating layers 104. In a specific embodiment, the top surface of the insulating layer 104 serves as an end point of the CMP process.

The gate electrode 107 can be the gate electrode of the transfer transistor.

Figure 5E:
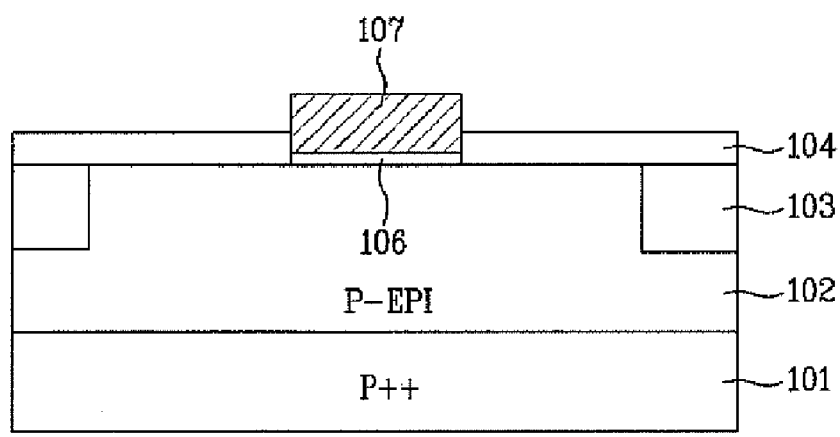

Referring to FIG. 5E, an etch-back process or a separate etching process can be performed using the gate electrode 107 as an etch mask to remove a predetermined thickness of the insulating layer 104 from the surface of the insulating layer 104.

In one embodiment, the thickness of the remaining insulating layer 104 can be about 50% of the thickness of the gate electrode 107.

Figure 5F:
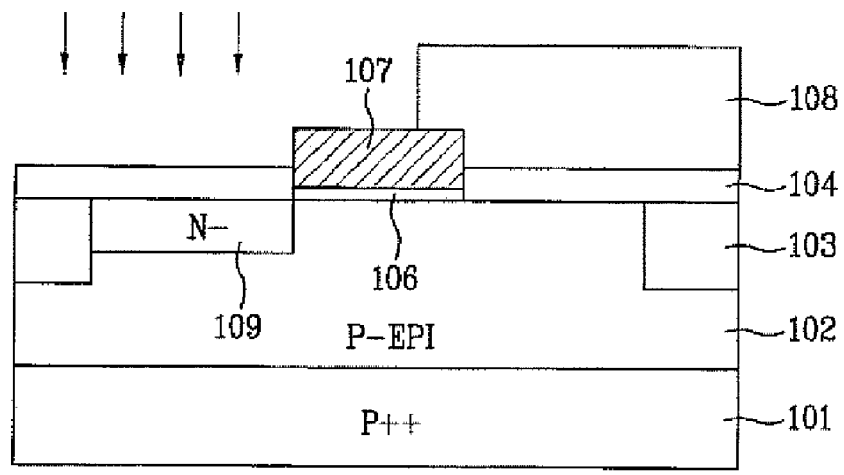

Then, referring to FIG. 5F, a second photoresist film 108 can be coated on the entire surface of the semiconductor substrate 101 including the gate electrode 107. The second photoresist film 108 can be selectively patterned by exposure and development processes such that each photodiode area can be exposed.

Then, low-density second conductive type (n– type) dopants can be implanted into the exposed photodiode area through the insulating layer 104 using the patterned second photoresist film 108 as a mask, thereby forming the low-density n– type diffusion area 109.

Figure 5G:
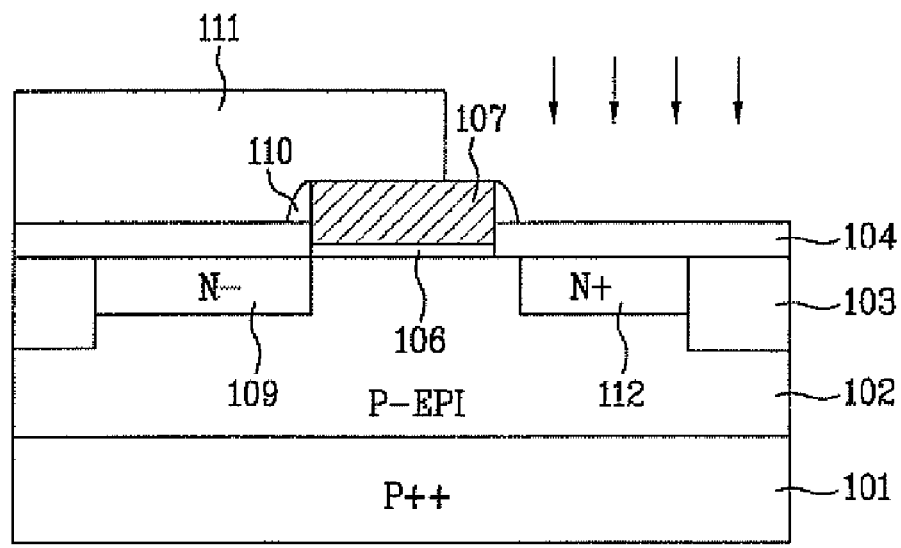

Then, referring to FIG. 5G, the second photoresist film 108 can be completely removed and an oxide layer can be formed on the entire surface of the semiconductor substrate 101. An etch-back process can be performed relative to the entire surface of the semiconductor substrate 101 to form insulating layer sidewalls 110 at both sides of the gate electrode 107.

Then, a third photoresist film 111 can be coated on the entire surface of the semiconductor substrate 101, and patterned by exposure and development processes to expose the source/drain area of each transistor.

Then, high-density n+ type dopants can be implanted into the exposed source/drain area using the patterned third photoresist film 111 as a mask, thereby forming a high-density n+ type diffusion area 112 (floating diffusion area) on the surface of the semiconductor substrate 101.

In a specific embodiment, the high-density n+ dopants can include As ions and a dose of about $4 \times 10^{15}/cm^{-2}$ can be implanted with ion implantation energy of about 80 keV.

Figure 5H:
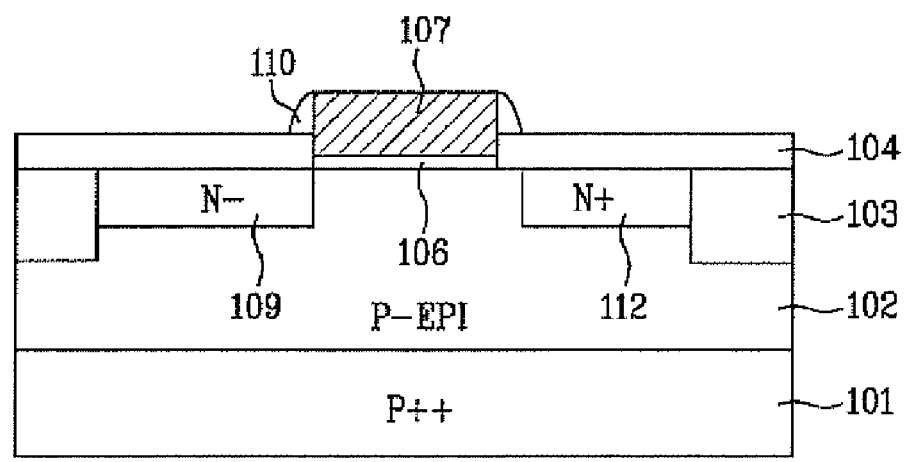

After that, referring to FIG. 5H, the third photoresist film 111 can be removed and a heat-treatment process (for example, rapid thermal process) can be performed with respect to the semiconductor substrate 101 to diffuse dopants in the n– type diffusion area 109 and the n+ type diffusion area 112.

It will be apparent to those skilled in the art that various modifications and variations can be made in the present invention. Thus, it is intended that the present invention covers the modifications and variations of this invention provided they come within the scope of the appended claims and their equivalents.

As described above, the CMOS image sensor and the fabrication method thereof can have advantages as follows.

First, since the gate electrode is formed by a CMP process, damage to the substrate to be formed with the photodiode can be reduced, so that dark current can be minimized or prevented at the surface of the photodiode, thereby improving the characteristics of the image sensor.

Second, since the insulating layer sidewall includes oxide, stress applied to the substrate can be reduced, so that the leakage current can be reduced at the surface of the substrate.

Third, since the insulating layer remains on the photodiode with a relatively thick thickness, it is possible to omit the process of depositing an anti-salicide layer, so that the manufacturing process can be simplified.

It should be understood that the examples and embodiments described herein are for illustrative purposes only and that various modifications or changes in light thereof will be suggested to persons skilled in the art and are to be included within the spirit and purview of this application.

I claim:

1. A method of fabricating a CMOS image sensor, comprising:

forming an insulating layer on a first conductive type semiconductor substrate;

defining a gate area by selectively removing the insulating layer such that a predetermined portion of a surface of the semiconductor substrate is exposed;

forming a gate insulating layer on the surface of the exposed semiconductor substrate;

forming a conductive layer on an entire surface of the semiconductor substrate and planarizing the conductive layer by adopting a top surface of the insulating layer as an end point, thereby forming a gate electrode on the gate insulating layer;

reducing a thickness of the insulating layer at both sides of the gate electrode;

forming an insulating layer sidewall on the insulating layer at both sides of the gate electrode;

forming a low-density second conductive type diffusion area on a photodiode area at a first side of the gate electrode; and forming a high-density second conductive type diffusion area on a transistor area at a second side of the gate electrode.

2. The method according to claim 1, wherein reducing the thickness of the insulating layer at both sides of the gate electrode comprises partially removing the insulating layer such that the insulating layer has a thickness of about 50% of a thickness of the gate electrode.

3. The method according to claim 1, wherein forming the insulating layer sidewall comprises depositing an oxide on an entire surface of the substrate and performing an etching-back process.

4. The method according to claim 1, wherein forming the gate insulating layer comprises performing a thermal oxidation process or a CVD process.

5. The method according to claim 1, wherein forming the high-density second conductive type diffusion area comprises implanting a dose of $4\times10^{15}/cm^{-2}$ of As ions with ion implantation energy of about 80 keV.

6. The method according to claim 1, wherein planarizing the conductive layer comprises performing a chemical mechanical polishing (CMP) process.

* * * * *